United States Patent
Ghosh et al.

(10) Patent No.: US 7,331,380 B2
(45) Date of Patent: Feb. 19, 2008

(54) RADIAL FLOW MICRO-CHANNEL HEAT SINK WITH IMPINGEMENT COOLING

(75) Inventors: Debashis Ghosh, Amherst, NY (US);
Mohinder Singh Bhatti, Amherst, NY (US); Ilya Reyzin, Williamsville, NY (US); Mark Joseph Parisi, East Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 365 days.

(21) Appl. No.: 11/205,338

(22) Filed: Aug. 17, 2005

(65) Prior Publication Data
US 2007/0039720 A1 Feb. 22, 2007

(51) Int. Cl.
*F28F 13/06* (2006.01)
(52) U.S. Cl. .................. 165/104.33; 165/125
(58) Field of Classification Search ...... 165/80.2–80.5, 165/125, 104.33, 104.19; 361/697, 699
See application file for complete search history.

(56) References Cited

U.S. PATENT DOCUMENTS

| 4,733,293 A | 3/1988 | Gabuzda |
|---|---|---|
| 4,838,041 A | 6/1989 | Bellows et al. |
| 5,132,780 A | 7/1992 | Higgins, III |
| 5,597,034 A | 1/1997 | Barker, III et al. |
| 6,219,242 B1 | 4/2001 | Martinez |
| 6,552,902 B2 | 4/2003 | Cho et al. |
| 2006/0023425 A1* | 2/2006 | Iijima et al. ................. 361/699 |
| 2006/0144569 A1* | 7/2006 | Crocker et al. ......... 165/104.33 |
| 2007/0115634 A1* | 5/2007 | Laing .......................... 361/699 |

* cited by examiner

*Primary Examiner*—Teresa J. Walberg
(74) *Attorney, Agent, or Firm*—Patrick M. Griffin

(57) ABSTRACT

A heat sink removes heat from an electronic device and comprises a base, a lid. An inner ring of first fins extend radially outwardly first length from an inner circle and extend axially a first height from the top surface of the base, and an outer ring of second fins extend radially inwardly a second length from an outer periphery and extend axially a second height from the top surface of the base. A confining plate extends radially above the fins and is spaced below the bottom surface of the lid whereby coolant fluid flows from an inlet opening of the lid through the center opening of the confining plate and radially outwardly through the fins and upward around the outer edge of the confining plate and into the space above the confining plate to an outlet opening. A nozzle having a throat is disposed above the lid and extends below the lid to the confining plate. A flow diverter extends upwardly from the top surface of the base and into and through the throat of the nozzle.

25 Claims, 6 Drawing Sheets

RADIAL FLOW MICRO-CHANNEL HEAT SINK WITH IMPINGEMENT COOLING

BACKGROUND OF THE INVENTION

1. Field of the Invention

The subject invention relates to a cooling assembly for cooling an electronic device such as a microprocessor or a computer chip.

2. Description of the Prior Art

These electronic devices generate a high concentration of heat, typically a power density in the range of 5 to 35 W/cm$^2$. Accordingly, research activities have focused on developing more efficient cooling assemblies capable of efficiently dissipating the heat generated from such electronic devices, while occupying a minimum of space.

A forced air cooling assembly typically includes a heat exchanger and a heat sink, and cools the electronic device by natural or forced convection cooling methods. The electronic device is attached to the heat sink and transfers heat thereto. The heat exchanger typically uses air to directly remove the heat from the heat sink. However, air has a relatively low heat capacity. Such forced air cooling assemblies are suitable for removing heat from relatively low power heat sources with a power density in the range of 5 to 15 W/cm$^2$. However, the increased computing speeds have resulted in a corresponding increase in the power density of the electronic devices in the order of 20 to 35 W/cm$^2$, thus requiring more effective cooling assemblies.

In response to the increased heat produced by the electronic devices, liquid-cooled cooling assemblies, commonly referred to as liquid cooled units ("LCUs") were developed. The LCUs employ a heat sink in conjunction with a high heat capacity cooling fluid, like water or water-glycol solutions, to remove heat from these types of higher power density heat sources. One type of LCU circulates the cooling fluid through the heat sink to remove the heat absorbed from the heat source affixed thereto. The cooling fluid is then transferred to a remote location where the heat is easily dissipated into a flowing air stream with the use of a liquid-to-air heat exchanger and an air moving device such as a fan or a blower. These types of LCUs are characterized as indirect cooling units since they remove heat form the heat source indirectly by a secondary working fluid. Generally, a single-phase liquid first removes heat from the heat sink and then dissipates it into the air stream flowing through the remotely located liquid-to-air heat exchanger. Such LCUs are satisfactory for a moderate heat flux less than 35 to 45 W/cm$^2$.

The LCUs of the prior art have included an axial inlet for coolant with a diverter to direct the coolant radially outward and into fins or vanes. Examples of such are illustrated in U.S. Pat. No. 4,733,293 to Gabuzda; U.S. Pat. No. 5,597,034 to Barker, III, et al.; U.S. Pat. No. 6,196,300 to Checchetti; U.S. Pat. No. 6,219,242 to Martinez and U.S. Pat. No. 6,719,038 to Bird et al. Each patent discloses a heat sink assembly having radial fins or vanes and used in a LCU. The heat sink assemblies include a base plate with a plurality of fins having smooth sidewalls extending upwardly from the base plate. In operation, the base plate absorbs the heat from the electronic device and transfers the heat to the fins. A cooling fluid flows past the smooth walled fins, drawing the heat from the fins, thereby removing the heat from the heat sink. The flow of cooling fluid is directed parallel to the fins by a central diverter.

The U.S. Pat. No. 5,019,880, issued to Higgins, discloses a heat sink that includes a circular base with a central flow diverter having a conical shape extending upwardly from the base. A plurality of planar fins is disposed radially about the circumference of the flow diverter and extends upwardly from the base to a lid. An inlet is disposed above the lid for directing a flow of cooling fluid axially onto the flow diverter. The flow of cooling fluid then circulates radially outward to the outer periphery of the base through a plurality of flow channels defined between the planar fins.

SUMMARY OF THE INVENTION AND ADVANTAGES

The subject invention provides such a heat sink assembly for removing heat from an electronic device wherein a plurality of fins extend upwardly from the top surface of the base and extend radially from an inner circle concentric with an inlet axis toward an outer periphery disposed about the inlet axis for directing the flow of cooling fluid radially from said inlet axis. The invention provides a confining plate having a center opening for receiving the flow of coolant fluid from the inlet opening in the lid and extends radially from the center opening above the fins and spaced below the bottom surface of said lid whereby coolant fluid flows from the inlet opening of the lid through the center opening of the confining plate and radially outwardly through the fins and upward around the outer edge of the confining plate and into the space above the confining plate.

In a more specific sense, an inner ring of fins is surrounded by a second ring of fins with the inner ring of fins having a lesser height than the outer second ring of fins.

Accordingly, the subject invention provides a heat sink assembly that optimizes the cooling fin arrangement to enhance cooling of an electronic component.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
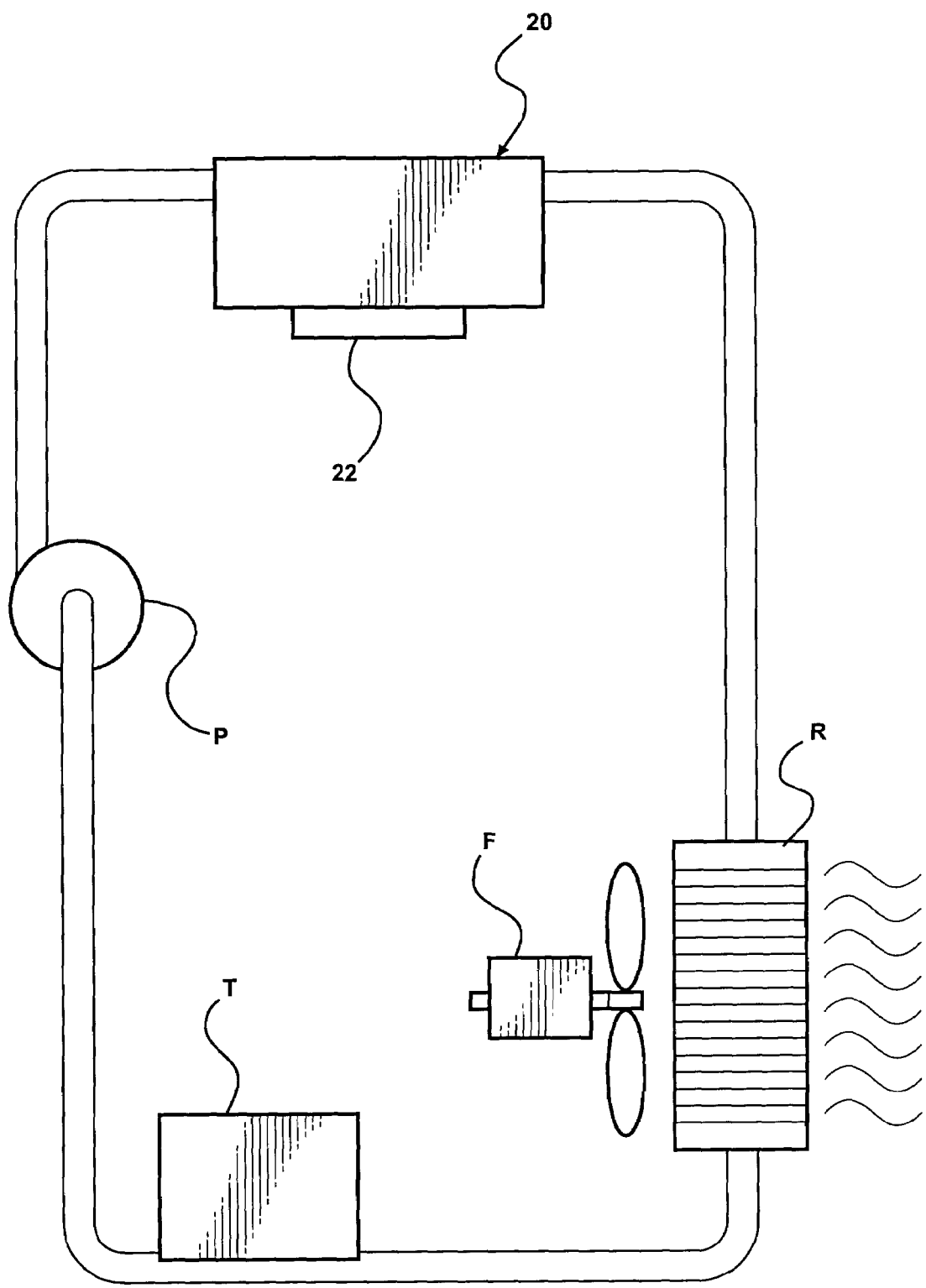
FIG. 1 is a schematic view of a system in which the subject invention finds utility.

FIG. 1 illustrates a system incorporating the heat sink 20 of the subject invention into a liquid cooling system. The liquid cooling system includes working fluid mover, such as a pump P, creates a flow of cooling fluid, usually a liquid, through a cooling fluid storage tank T, which stores excess cooling fluid. The pump P moves the cooling fluid through a heat extractor assembly to dissipate heat from the cooling fluid. The heat extractor includes a fan F and a radiator R. The radiator R can be of the well known type including tubes with cooling fins between the tubes to exchange heat between the cooling fluid passing through the tubes and air forced through the radiator R by the fan F.

The heat sink 20 assembly removes heat from an electronic device 22.

The essence of the heat sink 20 assembly is a housing having a base 24 with a top surface, a lid 26 with a bottom surface in spaced relationship with and parallel to the top surface of the base 24. The lid 26 defines an inlet opening 28 on an inlet axis A, and a nozzle 30 directs the flow of cooling fluid downwardly (as illustrated) along the axis A. An outer wall 32 extends vertically between the top surface of the base 24 and the bottom surface of the lid 26 and about the inlet axis A.

A plurality of fins 34, 36 extend upwardly from the top surface of the base 24 and extend radially from an inner circle a concentric with the inlet axis A toward an outer periphery b disposed about the inlet axis A for directing the flow of cooling fluid radially from the inlet axis A. More specifically, a plurality of first fins 34 disposed in an inner ring extend radially outwardly from the inner circle a first length $l_1$ and extend axially a first height $h_1$ from the top surface of the base 24, and a plurality of second fins 36 disposed in an outer ring extend radially inwardly from the outer periphery b a second length $l_2$ and extend axially a second height $h_2$ from the top surface of the base 24. The first height $h_1$ is less than the second height $h_2$ and one of the first fins 34 is radially aligned with every other one of the second fins 36.

Figure 2:
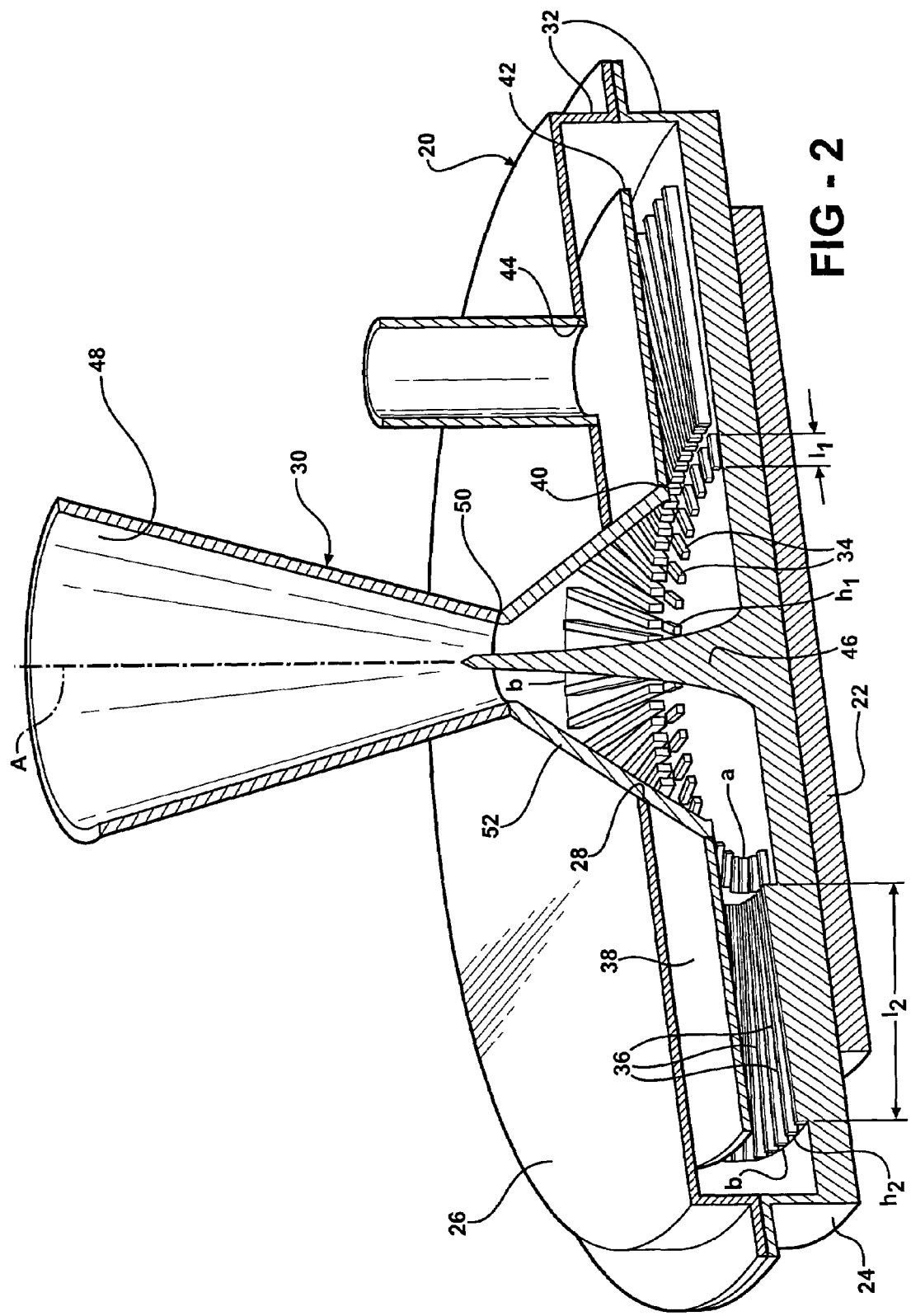
FIG. 2 is a cross sectional perspective view of the heat sink assembly of the subject invention.
Figure 3:
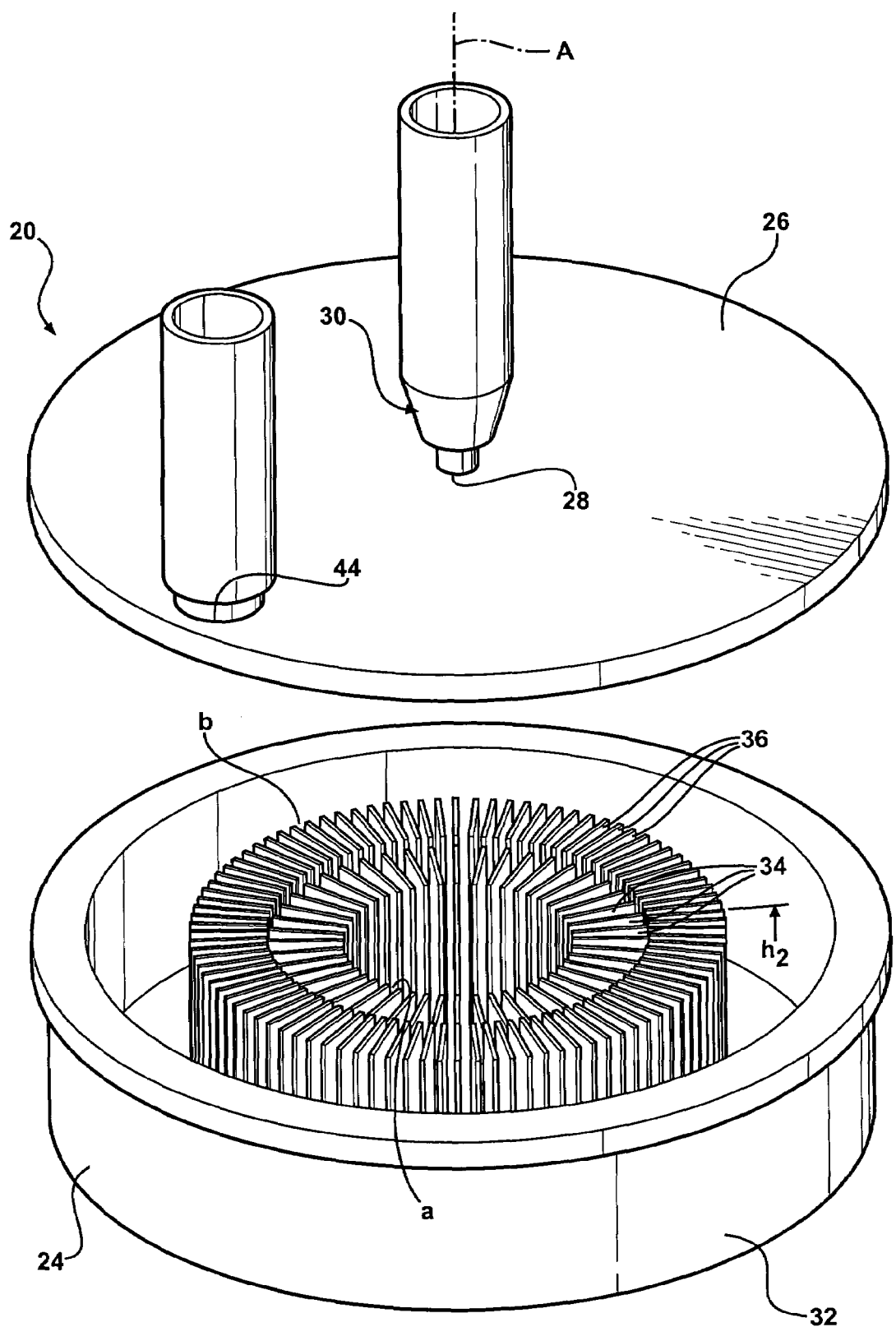
FIG. 3 is an exploded perspective view of a second embodiment of the heat sink assembly of the subject invention.
Figure 4:
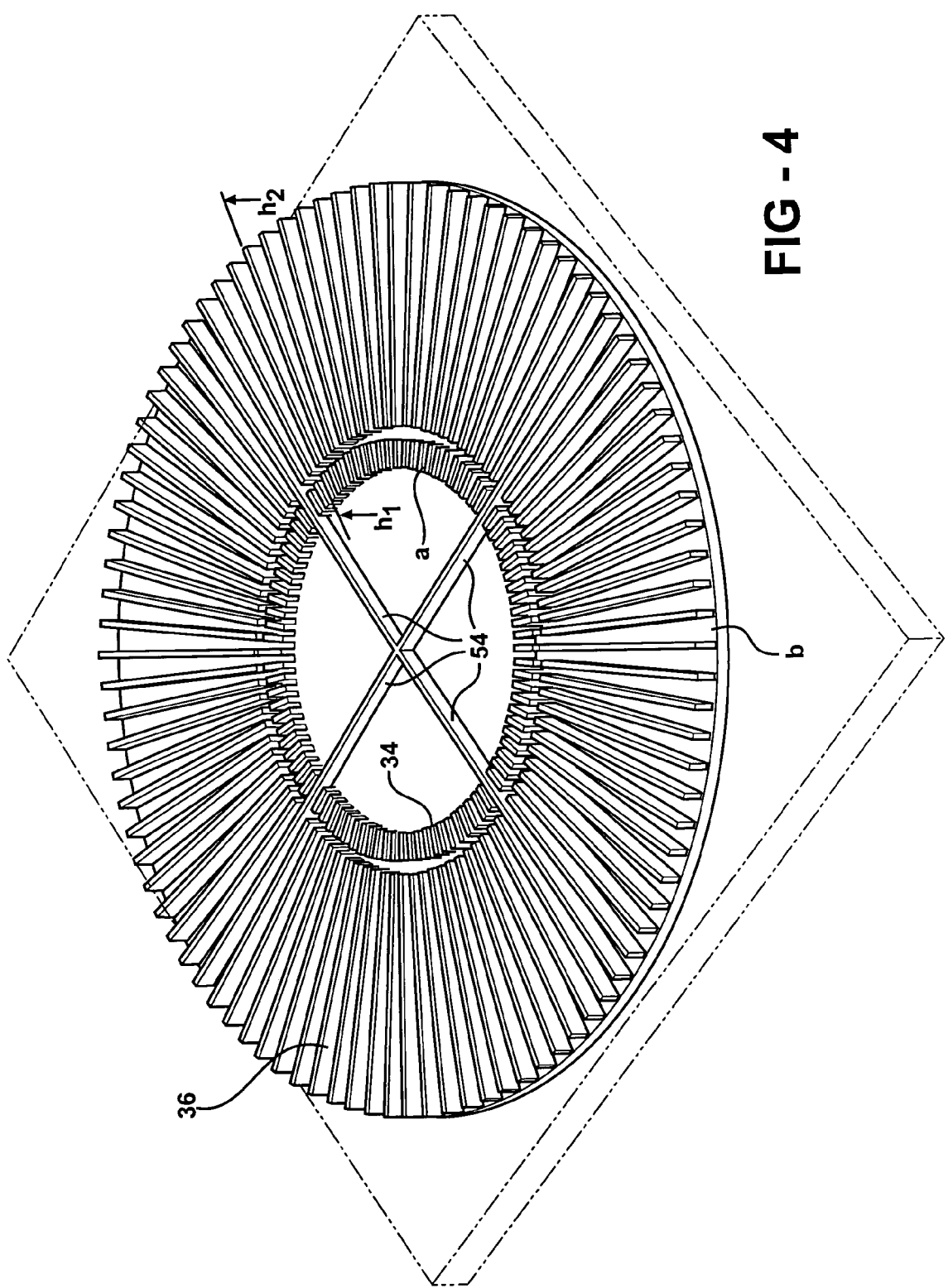
FIG. 4 is a perspective view of a third embodiment of the heat sink assembly of the subject invention, with one version being circular in hard lines and another version being square in phantom lines.

As illustrated in FIGS. 2-4 in solid lines, the outer periphery b of the second fins 36 defines a circle. However, the outer periphery b of the second fins 36 may define a square as shown in phantom in FIG. 4.

The heat sink 20 includes a confining plate 38 having a center opening 40 for receiving the flow of coolant fluid from the inlet opening 28 and nozzle 30 in the lid 26. The confining plate 38 extends radially from the center opening 40 above the fins 34, 36 and spaced below the bottom surface of the lid 26. The confining plate 38 extends radially from the center opening 40 to an outer edge 42 spaced radially inwardly from the outer wall 32. The lid 26 defines an outlet opening 44 disposed above the confining plate 38 whereby coolant fluid flows from the inlet opening 28 of the lid 26 through the center opening 40 of the confining plate 38 and radially outwardly through the fins 34, 36 and upward around the outer edge 42 of the confining plate 38 and into the space above the confining plate 38 to the outlet opening 44.

A flow diverter 46 extends upwardly about the inlet axis A from the top surface of the base 24 toward the bottom surface of the lid 26 whereby the inlet opening 28 and the center opening 40 and the nozzle 30 are aligned with the flow diverter 46 for impinging the flow of cooling fluid on the flow diverter 46 to re-direct the flow of fluid radially outwardly between the fins 34, 36. As alluded to above, the nozzle 30 is disposed in the inlet opening 28 of the lid 26 for delivering coolant flow to the center opening 40 of the confining plate 38 and into the flow diverter 46. The nozzle 30 extends below the lid 26 and is in sealed engagement with the center opening 40 of the confining plate 38. The nozzle 30 includes an entry portion 48 converging to a throat 50 and an exit portion 52 diverging from the throat 50. The throat 50 of the nozzle 30 is disposed above the lid 26 and the diverging exit portion 52 extends through and in sealing engagement with the lid 26 to the center opening 40 of the confining plate 38.

As illustrated in FIG. 4, selected ones 54 of the fins 34, 36 extend and cross at the axis A. These selected fins 34, 36 may include two pairs of aligned fins 34, 36 crossing at right angles at the axis A.

Figure 5:
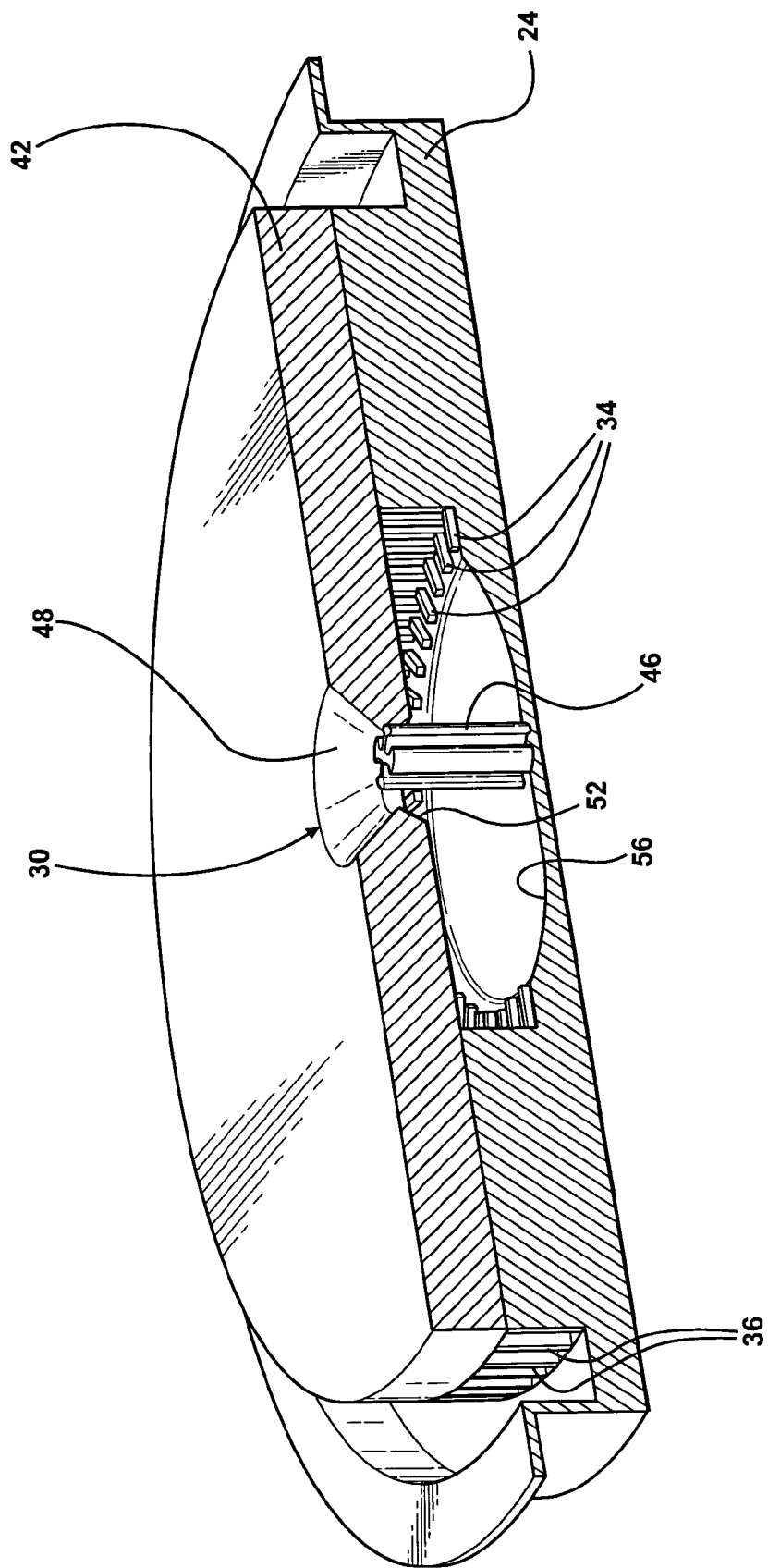
FIG. 5 is a cross sectional perspective view of the heat sink assembly of the subject invention including a dish-shaped recess about a cross-shaped flow diverter.

As illustrated in FIGS. 2 and 5, the flow diverter 46 extends upwardly from the top surface of the base 24 and into and through the throat of the nozzle 30. In the embodiment of FIG. 2, the flow diverter 46 has a decreasing circular cross-section from the top surface of the base 24 and into the nozzle 30. The flow diverter 46 may have a conical top, as illustrated or a flat top. With a circular cross-section, the flow diverter 46 defines an annular nozzle and in the case of the conical top, an oblique nozzle. On the other hand, the flow diverter 46 may have a cross-section forming an X from the top surface of the base 24 and into the nozzle (30), as illustrated in FIG. 5. In this case, multiple nozzles are defined by the X shape. The flow diverters 46 also present surfaces to extract heat from the flow through the nozzle.

As illustrated in FIG. 5, the top surface of the base 24 may include a dished shaped recess 56 disposed about the bottom of the flow diverter 46.

Figure 6:
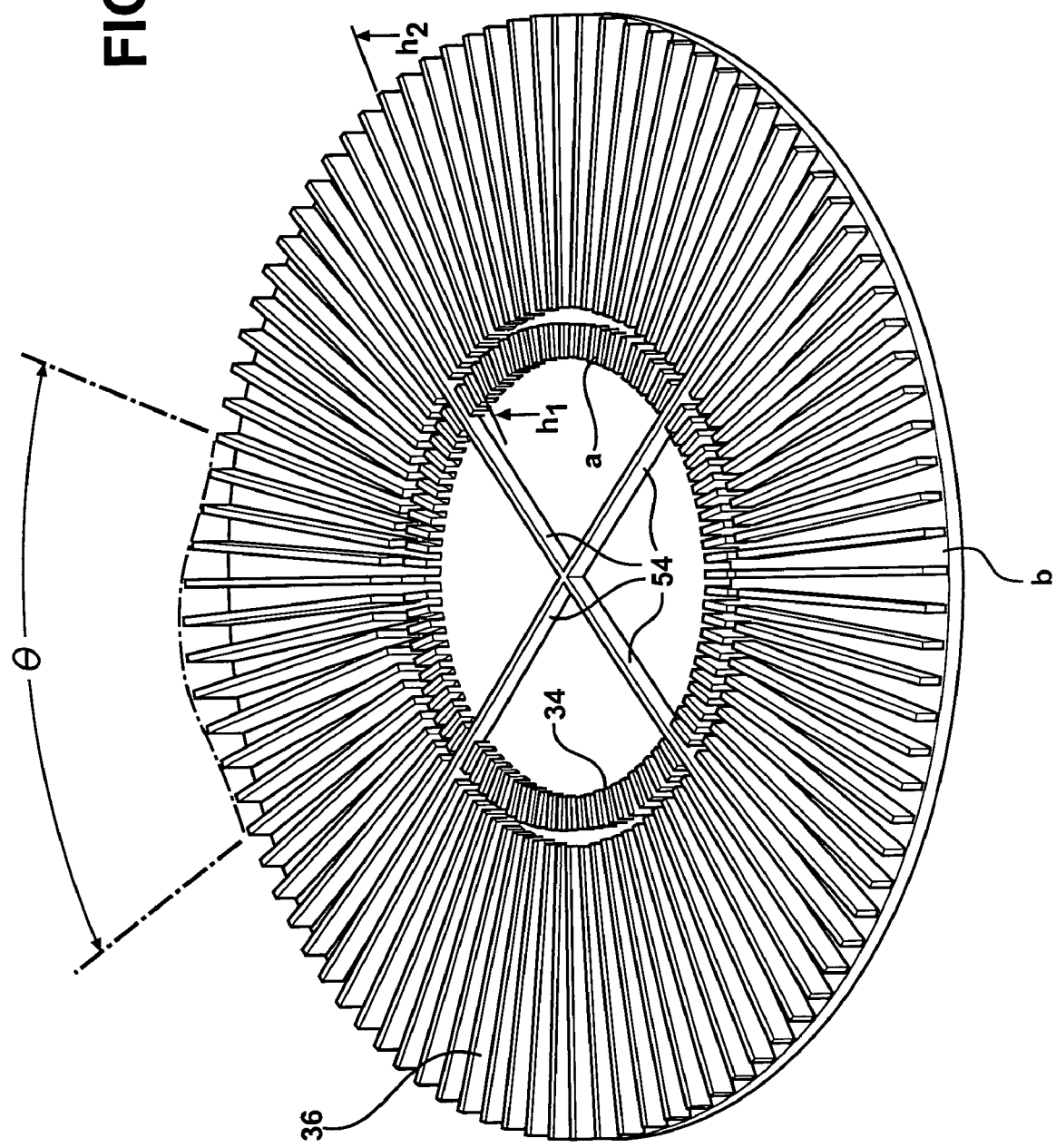
FIG. 6 is a perspective view similar to FIG. 4 but showing a wave-like varying fin height.

As illustrated in FIG. 6, the plurality of fins 34, 36 extend upwardly from the top surface of the base 24 higher in a predetermined sector defined by an angle θ about the inlet axis A. The plurality of fins 34, 36 extend higher upwardly in wave-like fashion from the top surface of the base 24 within the sector or angle θ. The fin height is varied circumferentially to account for hot spots with the fins having the greatest height on the radial of the hottest spot circumferentially.

The components are preferably of a metal and are wired together and placed in a furnace for being brazed together.

Obviously, many modifications and variations of the present invention are possible in light of the above teachings. The invention may be practiced otherwise than as specifically described within the scope of the appended claims.

What is claimed is:

1. A heat sink assembly for removing heat from an electronic device, said assembly comprising:
    a base having a top surface,
    a lid having a bottom surface in spaced relationship with and parallel to said top surface of said base,
    said lid defining an inlet opening on an inlet axis,
    an outer wall extending vertically between said top surface of said base and said bottom surface of said lid and about said inlet axis,
    a plurality of fins extending upwardly from said top surface of said base and extending radially from an inner circle concentric with said inlet axis toward an outer periphery disposed about said inlet axis for directing the flow of cooling fluid radially from said inlet axis, and
    characterized by a confining plate having a center opening for receiving the flow of coolant fluid from said inlet opening in said lid and extending radially from said center opening above said fins and spaced below said bottom surface of said lid.

2. An assembly as set forth in claim 1 wherein said confining plate extends radially from said center opening to an outer edge spaced radially inwardly from said outer wall.

3. An assembly as set forth in claim 2 wherein said lid defines an outlet opening disposed above said confining plate whereby coolant fluid flows from said inlet opening of said lid through said center opening of said confining plate and radially outwardly through said fins and upward around said outer edge of and above said confining plate to said outlet opening.

4. An assembly as set forth in claim 1 wherein said plurality of fins includes a plurality of first fins extending radially outwardly from said inner circle first length and extending axially a first height from said top surface of said base and a plurality of second fins extending radially inwardly from said outer periphery a second length and extending axially a second height from said top surface of said base, said first height being less than said second height.

5. An assembly as set forth in claim 4 wherein one of said first fins is radially aligned with every other one of said second fins.

6. An assembly as set forth in claim 5 including a flow diverter extending upwardly about said inlet axis from said top surface of said base toward said bottom surface of said lid whereby said inlet opening and said center opening are aligned with said flow diverter for impinging the flow of cooling fluid on said flow diverter to re-direct the flow of fluid radially outwardly between said fins.

7. An assembly as set forth in claim 2 including a nozzle disposed in said inlet opening of said lid for delivering coolant flow to said center opening of said confining plate.

8. An assembly as set forth in claim 7 wherein said nozzle extends below said lid and is in sealed engagement with said center opening of said confining plate.

9. An assembly as set forth in claim 8 wherein said nozzle includes an entry portion converging to a throat and an exit portion diverging from said throat.

10. An assembly as set forth in claim 9 wherein said throat of said nozzle is disposed above said lid and said diverging exit portion extends through and in sealing engagement with said lid to said center opening of said confining plate.

11. An assembly as set forth in claim 2 wherein selected ones of said fins extend and cross at said axis.

12. An assembly as set forth in claim 11 wherein said selected fins include two pairs of aligned fins crossing at right angles at said axis.

13. An assembly as set forth in claim 2 wherein said outer periphery of said fins defines a circle.

14. An assembly as set forth in claim 2 wherein said outer periphery of said fins defines a square.

15. An assembly as set forth in claim 1 including a flow diverter extending upwardly about said inlet axis from said top surface of said base toward said bottom surface of said lid whereby said inlet opening and said center opening are aligned with said flow diverter for impinging the flow of cooling fluid on said flow diverter to re-direct the flow of fluid radially outwardly, a nozzle disposed in said inlet opening of said lid for delivering coolant flow to said center opening of said confining plate, said flow diverter extending upwardly from said top surface of said base and into said nozzle.

16. An assembly as set forth in claim 15 wherein said flow diverter has a decreasing circular cross-section from said top surface of said base and into said nozzle.

17. An assembly as set forth in claim 16 wherein said flow diverter has a conical top.

18. An assembly as set forth in claim 15 wherein said flow diverter has a cross-section forming an X from said top surface of said base and into said nozzle.

19. An assembly as set forth in claim 15 wherein said top surface of said base includes a dished shaped recess disposed about said flow diverter.

20. An assembly as set forth in claim 1 wherein said plurality of fins extend upwardly from said top surface of said base higher in a predetermined sector about said inlet axis.

21. An assembly as set forth in claim 1 wherein said plurality of fins extend higher upwardly in wave-like fashion from said top surface of said base in a predetermined sector about said inlet axis.

22. An assembly as set forth in claim 3 including a fluid pump for circulating a flow of cooling fluid to said inlet opening and a heat exchanger for removing heat from the flow of cooling fluid exiting said outlet opening.

23. A heat sink assembly for removing heat from an electronic device, said assembly comprising:
   a base having a top surface,
   a lid having a bottom surface in spaced relationship with and parallel to said top surface of said base,
   said lid defining an inlet opening on an inlet axis,
   an outer wall extending vertically between said top surface of said base and said bottom surface of said lid and about said inlet axis,
   a plurality of first fins extending radially first length from an inner circle a concentric with said inlet axis toward an outer periphery disposed about said inlet axis for directing the flow of cooling fluid radially from said inlet axis,
   said first fins extending axially a first height $h_1$ from said top surface of said base,
   a plurality of second fins extending radially inwardly from said outer periphery a second length and extending axially a second height from said top surface of said base,
   one of said first fins being radially aligned with every other one of said second fins,
   said first height being less than said second height from said top surface of said base,
   a confining plate having a center opening for receiving the flow of coolant fluid from said inlet opening in said lid and extending radially from said center opening above said fins and spaced below said bottom surface of said lid to an outer edge spaced radially inwardly from said outer wall,
   a nozzle having entry portion converging to a throat and an exit portion diverging from said throat with said throat being disposed above said lid and said diverging exit portion extending through and in sealing engagement with said lid and into sealing engagement with said center opening of said confining plate, and
   said lid defines an outlet opening disposed above said confining plate whereby coolant fluid flows through said nozzle in said lid to said center opening of said confining plate and radially outwardly through said fins and upward around said outer edge of and above said confining plate to said outlet opening.

24. An assembly as set forth in claim 23 including a flow diverter extending upwardly about said inlet axis from said top surface of said base and into said nozzle for impinging the flow of cooling fluid on said flow diverter to re-direct the flow of fluid radially outwardly between said fins.

25. An assembly as set forth in claim 24 wherein said top surface of said base includes a dished shaped recess disposed about said nozzle.

* * * * *